(12) United States Patent
Chang et al.

(10) Patent No.: US 10,872,890 B2
(45) Date of Patent: Dec. 22, 2020

(54) SEMICONDUCTOR DEVICE

(71) Applicant: TAIWAN SEMICONDUCTOR MANUFACTURING CO., LTD., Hsinchu (TW)

(72) Inventors: Che-Cheng Chang, New Taipei (TW); Chih-Han Lin, Hsinchu (TW); Horng-Huei Tseng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/894,825

(22) Filed: Feb. 12, 2018

(65) Prior Publication Data

US 2018/0175030 A1 Jun. 21, 2018

Related U.S. Application Data

(63) Continuation of application No. 14/987,294, filed on Jan. 4, 2016, now Pat. No. 9,893,060.

(Continued)

(51) Int. Cl.
*H01L 27/088* (2006.01)
*H01L 21/8234* (2006.01)
(Continued)

(52) U.S. Cl.
CPC .... *H01L 27/0886* (2013.01); *H01L 21/28114* (2013.01); *H01L 21/823431* (2013.01); *H01L 21/823437* (2013.01); *H01L 21/823456* (2013.01); *H01L 29/4238* (2013.01); *H01L 29/42376* (2013.01); *H01L 29/6656* (2013.01);
(Continued)

(58) Field of Classification Search
CPC ............ H01L 27/0886; H01L 29/7848; H01L 29/42376; H01L 21/28114; H01L 21/823456; H01L 29/6656; H01L 21/823431; H01L 29/4238; H01L 21/823437; H01L 29/66545; H01L 29/78; H01L 27/088
See application file for complete search history.

(56) References Cited

U.S. PATENT DOCUMENTS 5,734,185 A * 3/1998 Iguchi ............... H01L 21/26586
257/336
6,365,917 B1 * 4/2002 Yamazaki ......... H01L 29/42384
257/72
(Continued)

FOREIGN PATENT DOCUMENTS

CN 1937250 A 3/2007
CN 103066021 A 4/2013
(Continued)

*Primary Examiner* — Edward Chin
(74) *Attorney, Agent, or Firm* — Maschoff Brennan

(57) ABSTRACT

A semiconductor device includes a substrate, a core device disposed above the substrate, and an input/output (I/O) device disposed above the substrate. The core device includes a first gate electrode having a bottom surface and a sidewall that define a first interior angle therebetween. The first interior angle is an obtuse angle. The I/O device includes a second gate electrode having a bottom surface and a sidewall that define a second interior angle therebetween. The second interior angle is greater than the first interior angle.

20 Claims, 15 Drawing Sheets

Related U.S. Application Data

(60) Provisional application No. 62/269,005, filed on Dec. 17, 2015.

(51) Int. Cl.
    *H01L 29/66*           (2006.01)
    *H01L 29/423*         (2006.01)
    *H01L 21/28*           (2006.01)
    *H01L 29/78*           (2006.01)

(52) U.S. Cl.
    CPC .... *H01L 29/66545* (2013.01); *H01L 29/7848* (2013.01); *H01L 27/088* (2013.01); *H01L 29/78* (2013.01)

(56) References Cited

U.S. PATENT DOCUMENTS

| | | | |
|---|---|---|---|
| 6,664,607 B2 * | 12/2003 | Yoshitake | H01L 27/0255 257/545 |
| 6,673,705 B2 * | 1/2004 | Miyashita | H01L 21/823857 257/E21.639 |
| 6,909,114 B1 * | 6/2005 | Yamazaki | H01L 29/78621 257/66 |
| 7,118,942 B1 | 10/2006 | Li et al. | |
| 7,163,850 B2 | 1/2007 | Oda et al. | |
| 7,173,283 B2 * | 2/2007 | Fujimoto | H01L 29/42384 257/359 |
| 7,528,445 B2 | 5/2009 | Phua et al. | |
| 7,602,010 B2 | 10/2009 | Choi et al. | |
| 7,939,895 B2 | 5/2011 | Fukasaku | |
| 8,957,422 B2 | 2/2015 | Yamazaki et al. | |
| 9,105,608 B2 * | 8/2015 | Yamazaki | H01L 29/7869 |
| 10,083,906 B1 * | 9/2018 | Jen | H01L 27/10891 |
| 2002/0135002 A1 * | 9/2002 | Nissa | H01L 21/823456 257/296 |
| 2002/0163036 A1 * | 11/2002 | Miura | H01L 21/823864 257/336 |
| 2002/0173128 A1 * | 11/2002 | Muller | H01L 29/6659 438/574 |
| 2003/0181015 A1 | 9/2003 | Komatsu et al. | |
| 2004/0051151 A1 * | 3/2004 | Dang | H01L 29/4908 257/408 |
| 2004/0056307 A1 * | 3/2004 | Cho | H01L 29/78609 257/347 |
| 2004/0113212 A1 * | 6/2004 | Lee | H01L 21/82385 257/408 |
| 2007/0134859 A1 * | 6/2007 | Curello | H01L 29/78639 438/151 |
| 2007/0173004 A1 * | 7/2007 | Hall | H01L 29/42376 438/197 |
| 2009/0057771 A1 * | 3/2009 | Fukasaku | H01L 29/4975 257/369 |
| 2009/0140438 A1 * | 6/2009 | Yamazaki | H01L 29/4908 257/776 |
| 2012/0280229 A1 * | 11/2012 | Suzuki | H01L 27/1218 257/43 |
| 2013/0099320 A1 | 4/2013 | Lee et al. | |
| 2013/0168743 A1 * | 7/2013 | Dove | H01L 29/66553 257/288 |
| 2014/0073093 A1 | 3/2014 | Farmer et al. | |
| 2015/0084064 A1 * | 3/2015 | Yamamoto | H01L 29/7834 257/77 |
| 2015/0187946 A1 | 7/2015 | Park et al. | |
| 2016/0172596 A1 * | 6/2016 | Rutherglen | H01L 51/055 257/9 |
| 2016/0218219 A1 * | 7/2016 | Asami | C23C 16/45531 |
| 2016/0260822 A1 | 9/2016 | Okamoto et al. | |
| 2017/0179117 A1 * | 6/2017 | Chang | H01L 21/823437 |
| 2017/0213828 A1 * | 7/2017 | Chang | H01L 21/28114 |
| 2018/0053829 A1 * | 2/2018 | Smith | H01L 29/66628 |
| 2018/0138212 A1 * | 5/2018 | Yamazaki | H01L 21/47573 |

FOREIGN PATENT DOCUMENTS

| | | |
|---|---|---|
| JP | 2006128413 A | 5/2006 |
| JP | 2008041886 A | 2/2008 |
| JP | 2010263169 A | 11/2010 |

* cited by examiner

SEMICONDUCTOR DEVICE

PRIORITY CLAIM AND CROSS-REFERENCE

This is a continuation application of the U.S. application Ser. No. 14/987,294, filed Jan. 4, 2016, now U.S. Pat. No. 9,893,060, issued on Feb. 13, 2018, which claims priority to U.S. Provisional Application Ser. No. 62/269,005, filed Dec. 17, 2015, which are herein incorporated by reference in their entirety.

BACKGROUND

Semiconductor devices are small electronic components that are fabricated on a semiconductor wafer substrate. Using a variety of fabrication techniques, these devices are made and connected together to form integrated circuits. A number of integrated circuits may be found on one chip, and are capable of performing a set of useful functions in the operation of an electronic appliance. Examples of such electronic appliances are mobile telephones, personal computers, and personal gaming devices. As the size of these popular devices would imply, the components formed on a chip are small.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
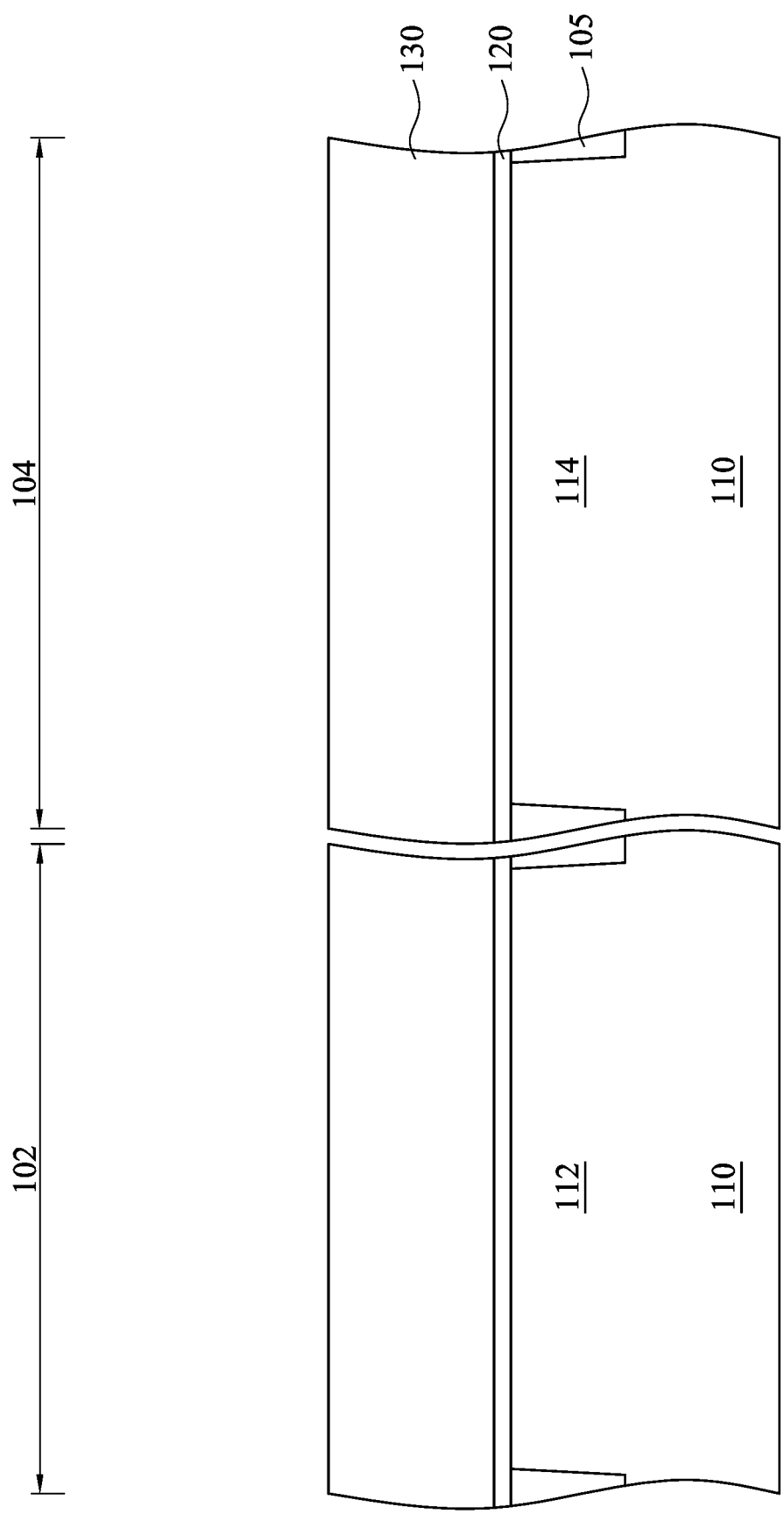
FIGS. 1A to 1K are cross-sectional views of a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Examples of devices that can be improved from one or more embodiments of the present application are semiconductor devices. Such a device, for example, is a Fin field effect transistor (FinFET) device. The following disclosure will continue with a FinFET example to illustrate various embodiments of the present application. It is understood, however, that the application should not be limited to a particular type of device.

FIGS. 1A to 1K are cross-sectional views of a method for manufacturing a semiconductor device at various stages in accordance with some embodiments of the present disclosure. Reference is made to FIG. 1A. A substrate 110 is provided. The substrate 110 has at least one core region 102 and at least one input/output (I/O) region 104. For example, in FIG. 1A, the substrate 110 has one core region 102 and one I/O region 104. In some embodiments, the substrate 110 includes silicon. Alternatively, the substrate 110 may include germanium, silicon germanium, gallium arsenide or other appropriate semiconductor materials. Also alternatively, the substrate 110 may include an epitaxial layer. For example, the substrate 110 may have an epitaxial layer overlying a bulk semiconductor. Further, the substrate 110 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrate may be formed by selective epitaxial growth (SEG). Furthermore, the substrate 110 may include a semiconductor-on-insulator (SOI) structure. Also alternatively, the substrate 110 may include a buried dielectric layer, such as a buried oxide (BOX) layer, such as that formed by separation by implantation of oxygen (SIMOX) technology, wafer bonding, SEG, or other appropriate method.

At least one semiconductor fin 112 and at least one semiconductor fin 114 are formed on the substrate 110. The semiconductor fin 112 is formed on the core region 102 of the substrate 110, and the semiconductor fin 114 is formed on the I/O region 104 of the substrate 110. In some embodiments, the semiconductor fins 112 and 114 include silicon. The semiconductor fins 112 and 114 may be formed, for example, by patterning and etching the substrate 110 using photolithography techniques. In some embodiments, a layer of photoresist material (not shown) are sequentially deposited over the substrate 110. The layer of photoresist material is irradiated (exposed) in accordance with a desired pattern (the semiconductor fins 112 and 114 in this case) and developed to remove portions of the photoresist material. The remaining photoresist material protects the underlying material from subsequent processing steps, such as etching. It should be noted that other masks, such as an oxide or silicon nitride mask, may also be used in the etching process.

An interlayer dielectric 120 is formed to cover the semiconductor fins 112 and 114 and the substrate 110. The interlayer dielectric 120 may be formed by thermal oxidation, chemical vapor deposition, sputtering, or other methods known and used in the art for forming a gate dielectric. Depending on the technique of dielectric layer formation, the thickness of the interlayer dielectric 120 on the top of the semiconductor fins 112 and 114 may be different from the thickness of the interlayer dielectric 120 on the sidewall (not shown) of the semiconductor fins 112 and 114. The interlayer dielectric 120 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. Some embodiments may include hafnium oxide ($HfO_2$), hafnium silicon oxide (HfSiO), hafnium silicon oxynitride (HfSiON), hafnium tantalum oxide (HfTaO), hafnium titanium oxide (HMO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. The interlayer dielectric 120 may have a multilayer structure such as one layer of silicon oxide (e.g., interfacial layer) and another layer of high-k material. The interlayer dielectric 120 may be formed using chemical vapor deposition (CVD), physical vapor deposition (PVD), atomic layer deposition (ALD), thermal oxide, ozone oxidation, other suitable processes, or combinations thereof.

A dummy layer 130 is formed on the interlayer dielectric 120. The dummy layer 130 may be deposited by chemical vapor deposition (CVD), by sputter deposition, or by other techniques known and used in the art for depositing conductive materials. The dummy layer 130 may include polycrystalline-silicon (poly-Si) or poly-crystalline silicon-germanium (poly-SiGe). Further, the dummy layer 130 may be doped poly-silicon with uniform or non-uniform doping.

Figure 1B:
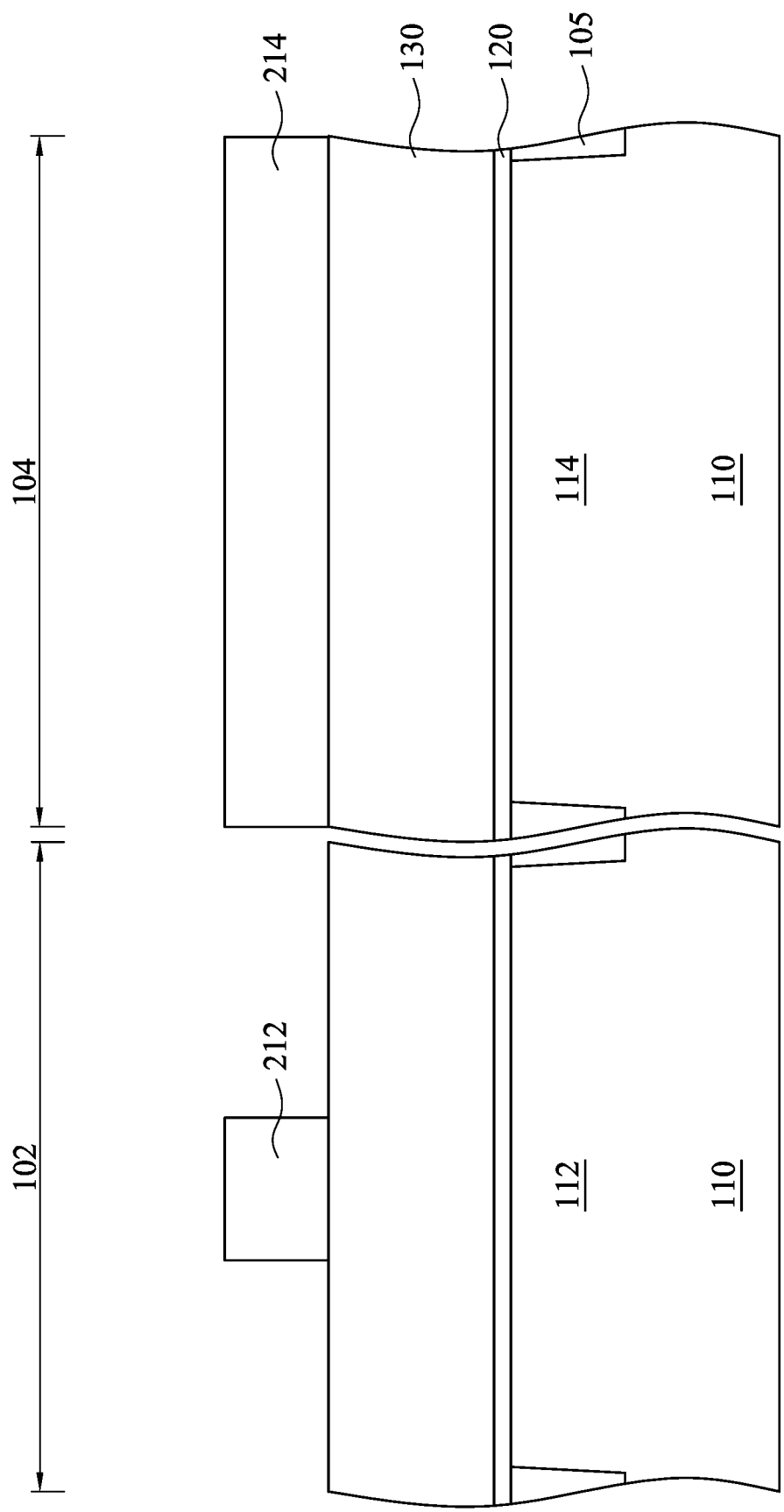

Reference is made to FIG. 1B. A patterned mask layer is formed on the dummy layer 130. The patterned mask layer includes masks 212 and 214. The mask 212 defines a profile of a gate electrode disposed on the semiconductor fin 112, and the mask 214 covers the dummy layer 130 disposed on the I/O region 104 of the substrate 110.

Figure 1C:
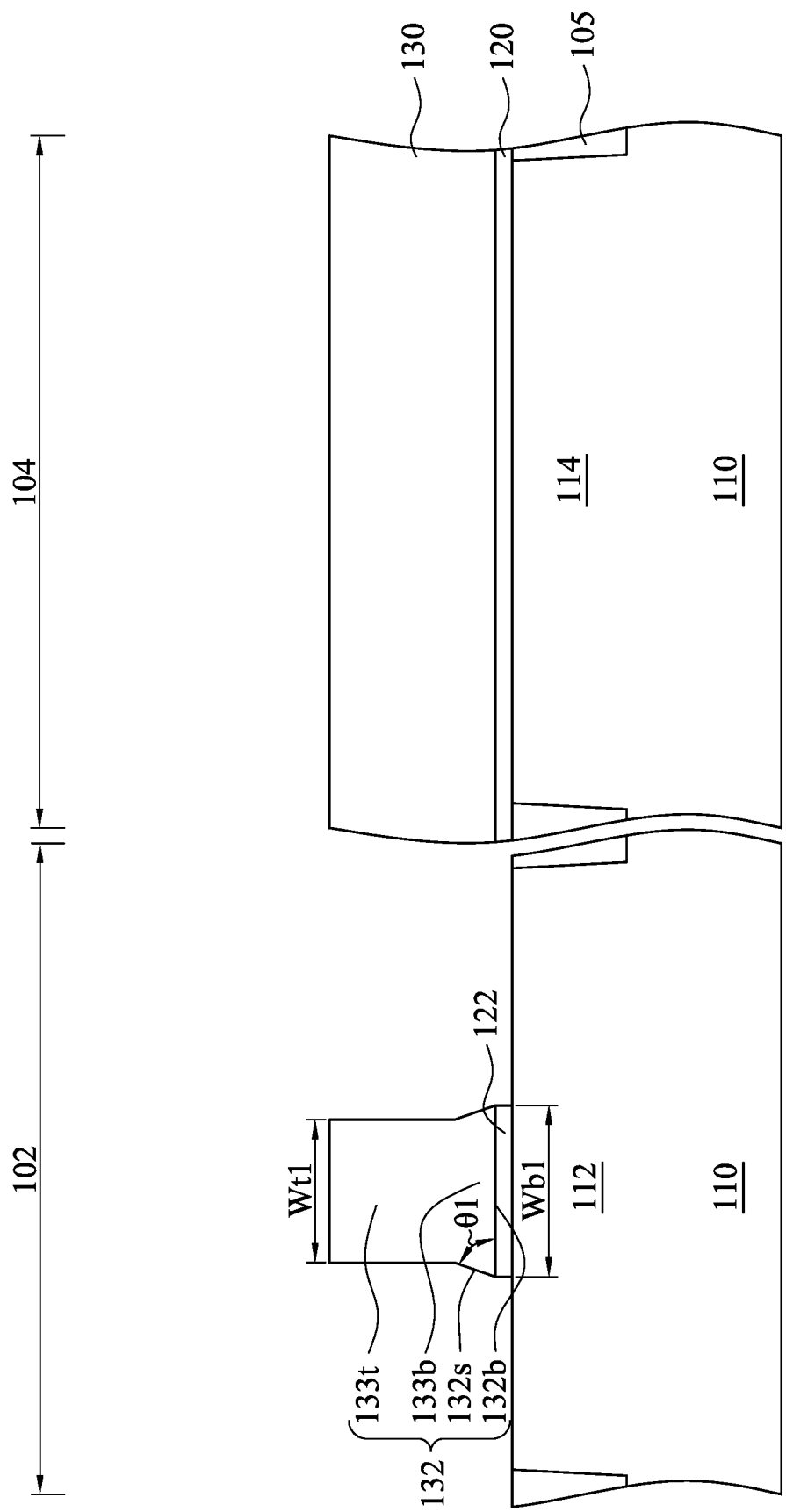

Reference is made to FIG. 1C. The dummy layer 130 of FIG. 1B disposed on the core region 102 of the substrate 110 is then patterned to form a dummy gate electrode 132 by using the mask 212 (see FIG. 1B). The dummy layer 130 may be patterned by an etching process, such as a dry plasma etching process or a wet etching process. At least one parameter, such as etchant, etching temperature, etching solution concentration, etching pressure, source power, radio frequency (RF) bias voltage, etchant flow rate, of the patterning (or etching) recipe can be tuned.

After the patterning process, the masks 212 and 214 of FIG. 1B may then be removed. The portion of the interlayer dielectric 120 disposed on the core region 102 of the substrate 110 and not covered by the dummy gate electrode 132 may or may not be removed during the etching process. In the case where some interlayer dielectric 120 remains on the semiconductor fin 112 not covered by the dummy gate electrode 132, the interlayer dielectric 120 may be subsequently removed by dry or wet etching to form a gate dielectric 122.

In FIG. 1C, the dummy gate electrode 132 has a footing profile. In greater detail, the dummy gate electrode 132 has a bottom surface 132b and at least one sidewall 132s. The bottom surface 132b and the sidewall 132s intersect to form an interior angle θ1. The interior angle θ1 is an angle inside the dummy gate electrode 132. In FIG. 1C, the interior angle θ1 is an acute angle. That is, the interior angle θ1 is less than 90 degrees. To describe from another point of view, the dummy gate electrode 132 includes a top portion 133t and a bottom portion 133b disposed between the top portion 133t and the substrate 110. The top portion 133t has a width Wt1, and the bottom portion 133b has a width Wb1. The width Wb1 of the bottom portion 133b is greater than the width Wt1 of the top portion 133t.

Figure 2A:
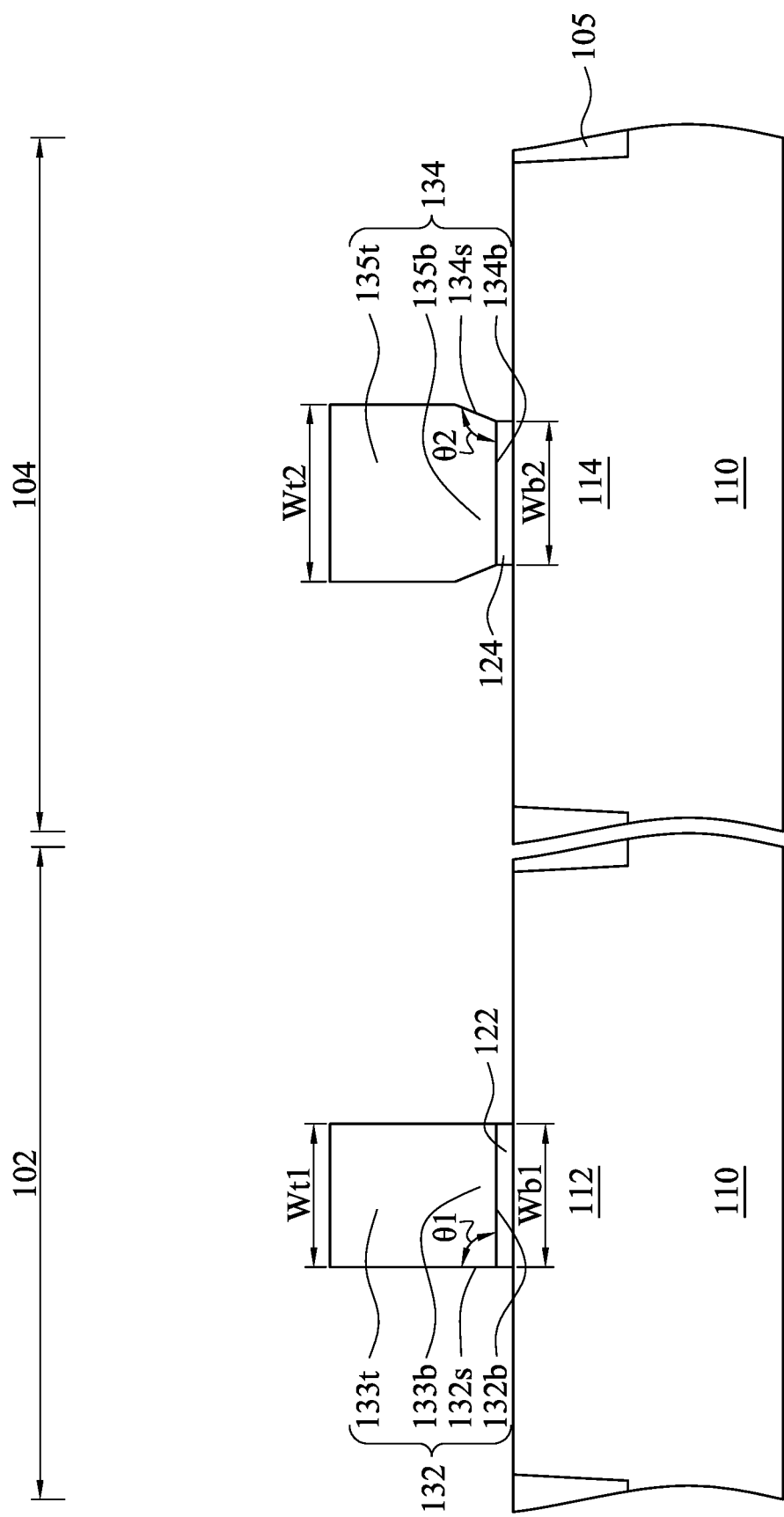
FIGS. 2A and 2B are cross-sectional views of the semiconductor device at stage of FIG. 1C in accordance with some embodiments of the present disclosure.
Figure 2B:
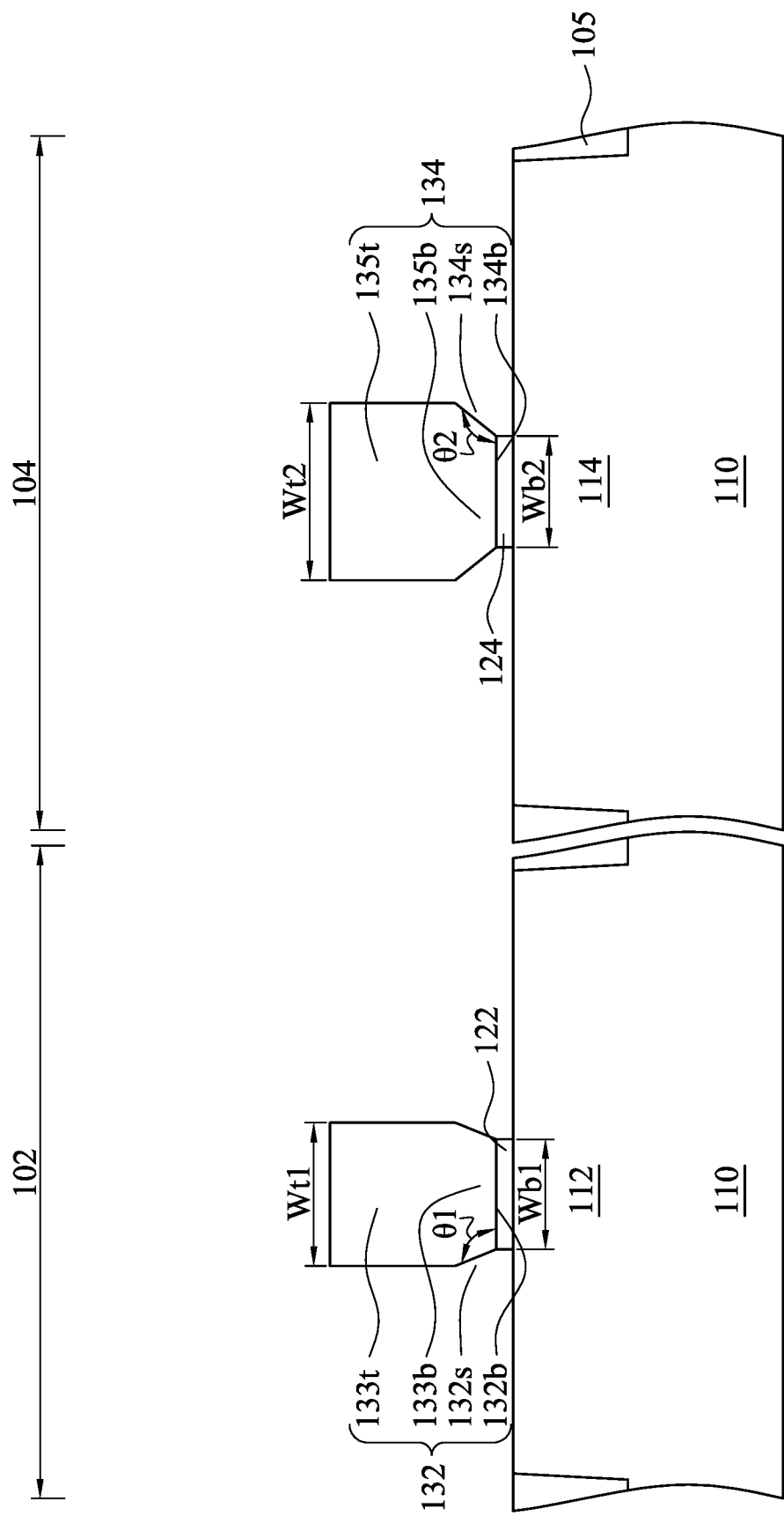

However, the profile of the dummy gate electrode 132 is not limited in this respect. FIGS. 2A and 2B are cross-sectional views of the semiconductor device at stage of FIG. 1C in accordance with some embodiments of the present disclosure. In FIG. 2A, the interior angle θ1 is a substantially right angle. That is, the interior angle θ1 is substantially 90 degrees. Furthermore, the width Wb1 of the bottom portion 133b is substantially the same as the width Wt1 of the top portion 133t. The term "substantially" as used herein may be applied to modify any quantitative representation which could permissibly vary without resulting in a change in the basic function to which it is related. In FIG. 2B, the interior angle θ1 is an obtuse angle. That is, the interior angle θ1 is greater than 90 degrees. Furthermore, the width Wb1 of the bottom portion 133b is narrower than the width Wt1 of the top portion 133t. Hence, the dummy gate electrode 132 in FIG. 2B has a notch profile.

The profiles of the dummy gate electrode 132 can be tuned by patterning recipes. That is, the patterning (or etching) setting affects the profile. Therefore, by tuning the patterning conditions, such as etching time, etchant types, etc., the profile of the dummy gate electrode 132 can be tuned.

Figure 1D:
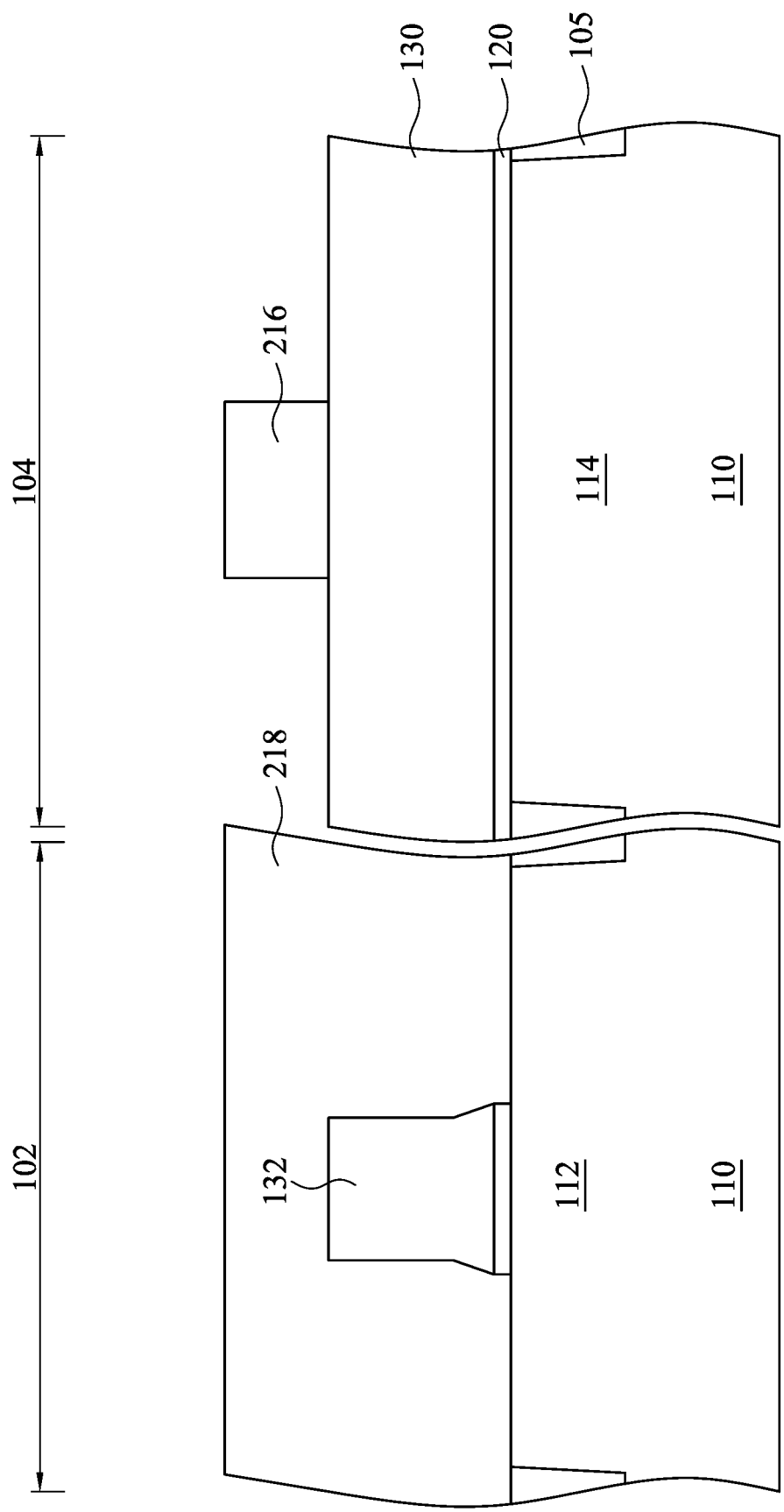

Reference is made to FIG. 1D. Another patterned mask layer is formed on the remaining dummy layer 130 and the dummy gate electrode 132. The patterned mask layer includes masks 216 and 218. The mask 216 defines a profile of a gate electrode disposed on the semiconductor fin 114, and the mask 218 covers the core region 102 of the substrate 110.

Figure 1E:
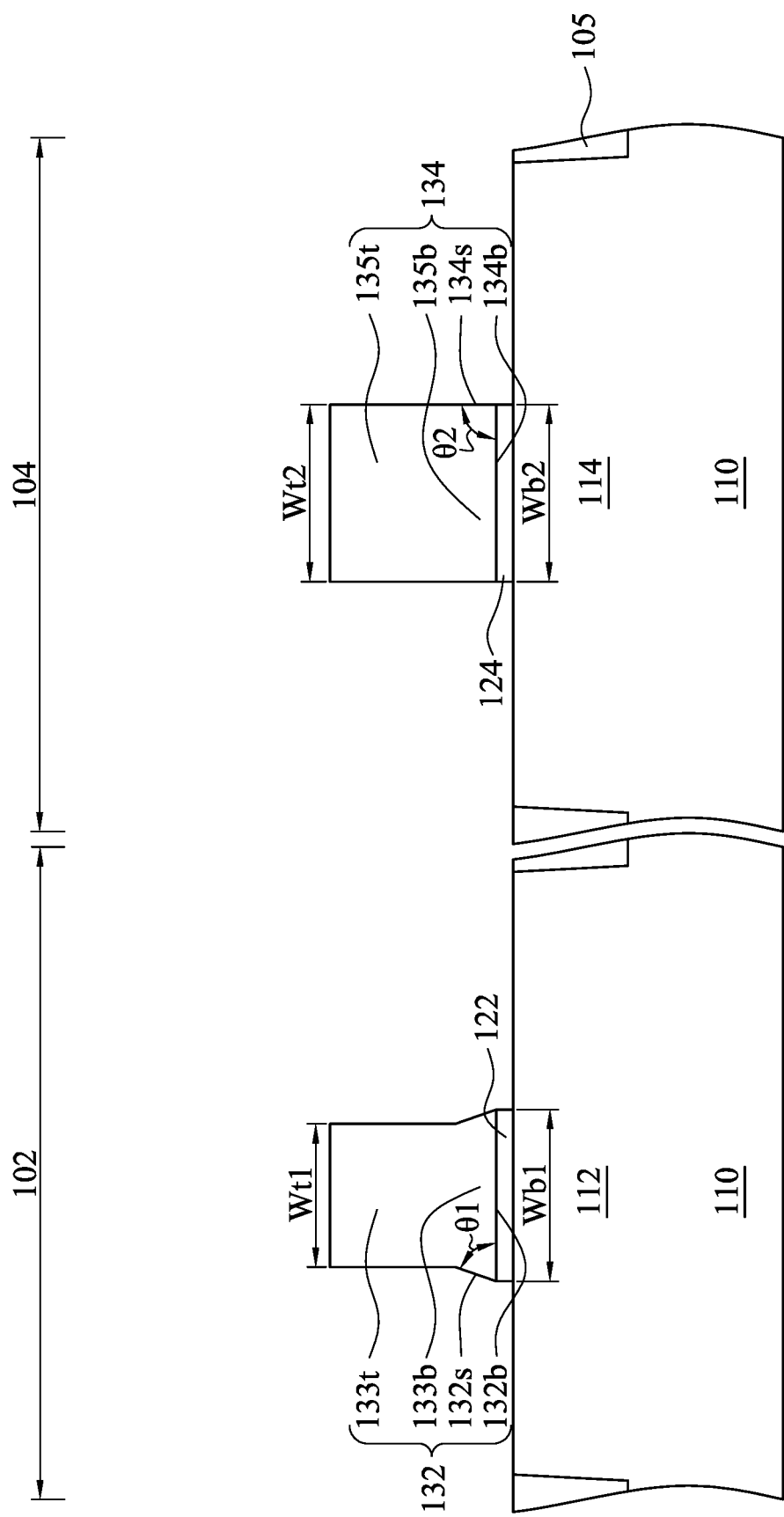

Reference is made to FIG. 1E. The remaining dummy layer 130 of FIG. 1D disposed on the I/O region 104 of the substrate 110 is then patterned to form a dummy gate electrode 134 by using the mask 216 (see FIG. 1D). The remaining dummy layer 130 may be patterned by an etching process, such as a dry plasma etching process or a wet etching process. At least one parameter, such as etchant, etching temperature, etching solution concentration, etching pressure, source power, radio frequency (RF) bias voltage, etchant flow rate, of the patterning (or etching) recipe can be tuned.

After the patterning process, the masks 216 and 218 of FIG. 1D may then be removed. The portion of the interlayer dielectric 120 not covered by the dummy gate electrode 134 may or may not be removed during the etching process. In the case where some interlayer dielectric 120 remains on the semiconductor fin 114 not covered by the dummy gate electrode 134, the interlayer dielectric 120 may be subsequently removed by dry or wet etching to form a gate dielectric 124.

In FIG. 1E, the dummy gate electrode 134 has a bottom surface 134b and at least one sidewall 134s. The bottom surface 134b and the sidewall 134s intersect to form an interior angle θ2. The interior angle θ2 is an angle inside the dummy gate electrode 134. In FIG. 1E, the interior angle θ2 is a substantially right angle. That is, the interior angle θ2 is substantially 90 degrees. To describe from another point of view, the dummy gate electrode 134 includes a top portion 135t and a bottom portion 135b disposed between the top portion 135*t* and the substrate 110. The top portion 135*t* has a width Wt2, and the bottom portion 135*b* has a width Wb2. The width Wb2 of the bottom portion 135*b* is substantially the same as the width Wt2 of the top portion 135*t*.

However, the profile of the dummy gate electrode 134 is not limited in this respect. Reference is made to FIGS. 2A and 2B. In FIGS. 2A and 2B, the interior angles θ2 are obtuse angles. That is, the interior angles θ2 are greater than 90 degrees. Furthermore, the width Wb2 of the bottom portion 135*b* is narrower than the width Wt2 of the top portion 135*t*. Hence, the dummy gate electrodes 134 in FIGS. 2A and 2B have notch profiles.

The profiles of the dummy gate electrode 134 can be tuned by patterning conditions. That is, the patterning (or etching) setting affects the profile. Therefore, by tuning the patterning conditions, such as etching time, etchant type, etc., the profile of the dummy gate electrode 134 can be tuned.

In FIGS. 1E, 2A, and 2B, the interior angle θ1 is greater than the interior angle θ2. Furthermore, the widths Wb1, Wb2, Wt1, and Wt2 satisfy the relationship of (Wb1−Wt1)>(Wb2−Wt2). For example, the value of (Wb1−Wt1)−(Wb2−Wt2) is in a range of about 1 Angstrom to about 100 nm. Moreover, the width Wt2 of the dummy gate electrode 134 is greater than the width Wt1 of the dummy electrode 132.

Figure 1F:
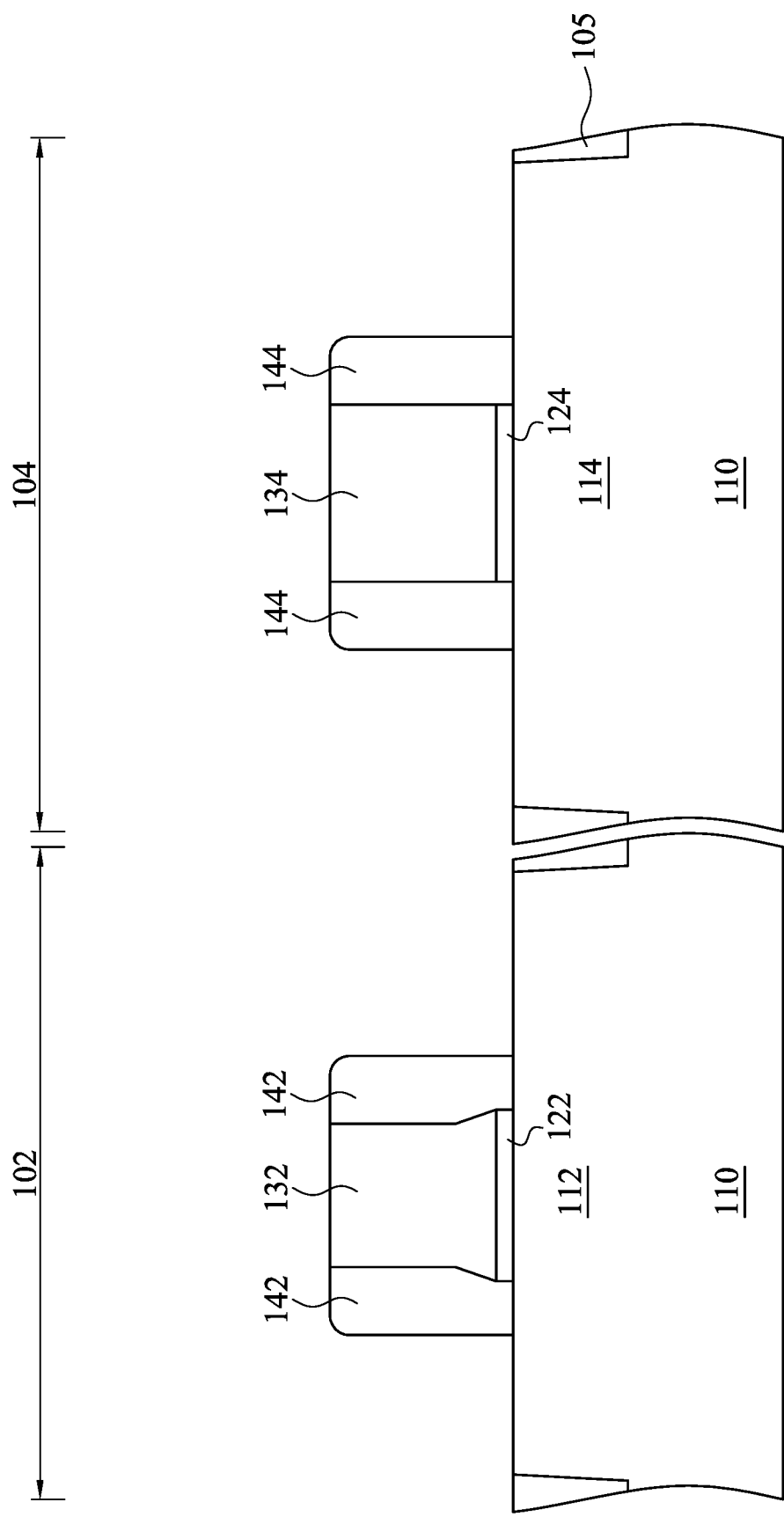

Reference is made to FIG. 1F. A pair of gate spacers 142 is formed on the substrate 110 and along the dummy gate electrode 132, and a pair of gate spacers 144 is formed on the substrate 110 and along the dummy gate electrode 134. In some embodiments, the gate spacers 142 and 144 may include silicon oxide, silicon nitride, silicon oxy-nitride, or other suitable material. The gate spacers 142 and 144 may include a single layer or multilayer structure. To form the gate spacers 142 and 144, a blanket layer may be formed on the substrate 110 by CVD, PVD, ALD, or other suitable technique. Then, an anisotropic etching is performed on the blanket layer to form the gate spacers 142 and 144 respectively on two sides of the dummy gate electrodes 132 and 134. In some embodiments, the gate spacers 142 and 144 are used to offset subsequently formed doped regions, such as source/drain regions. The gate spacers 142 and 144 may further be used for designing or modifying the source/drain region (junction) profile.

Figure 1G:
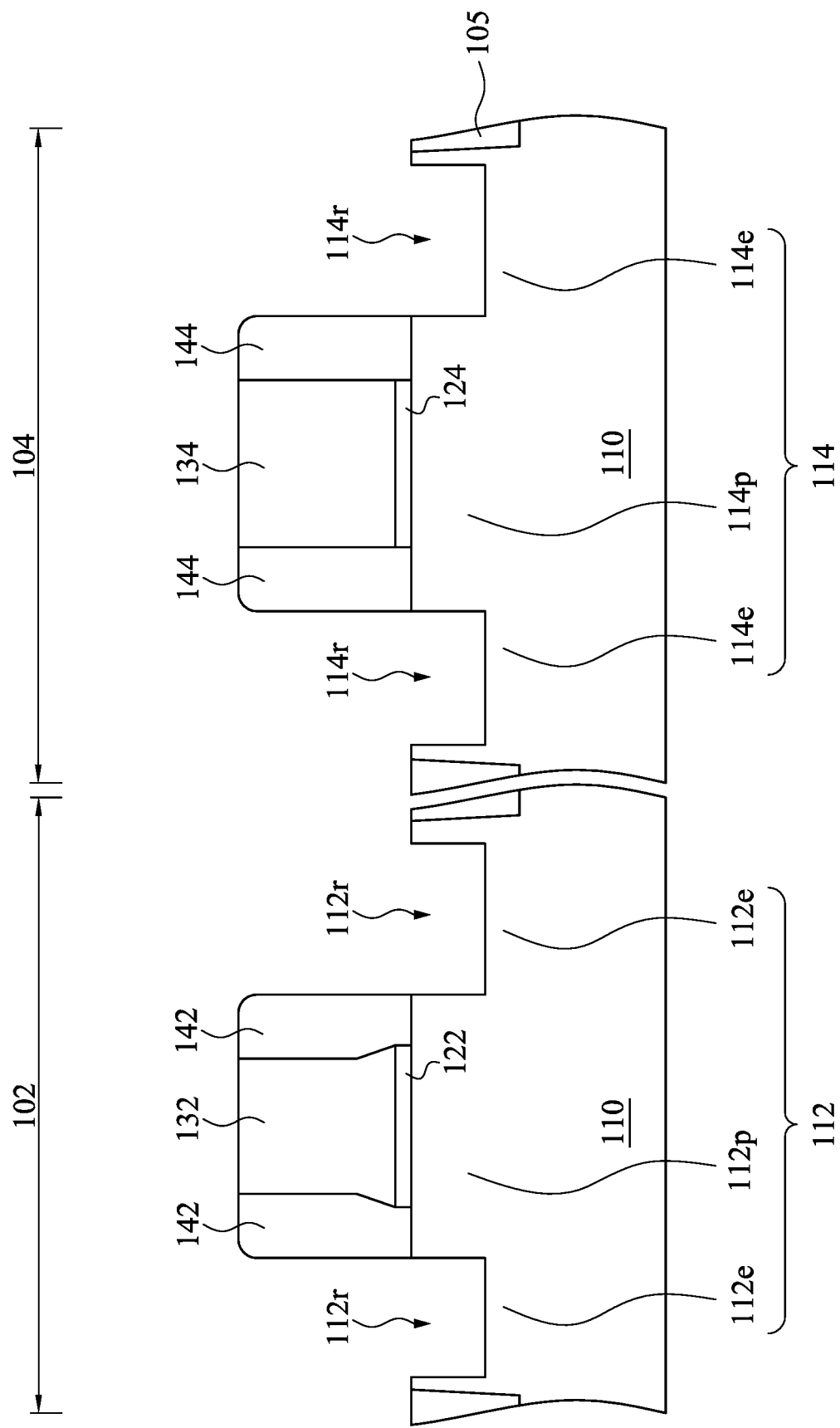

Reference is made to FIG. 1G. Portions of the semiconductor fins 112 and 114 exposed both by the dummy gate electrodes 132 and 134 and the gate spacers 142 and 144 are removed (or recessed) to form recesses 112*r* and 114*r* in the substrate 110. Any suitable amount of material may be removed. The remaining semiconductor fin 112 has embedded portions 112*e* and a protruding portion 112*p*, and the remaining semiconductor fin 114 has embedded portions 114*e* and a protruding portion 114*p*. The embedded portions 112*e* and 114*e* are embedded in the substrate 110 and portions thereof are exposed by the recesses 112*r* and 114*r*. The protruding portions 112*p* and 114*p* are respectively disposed under the dummy gate electrodes 132 and 134.

Removing portions of the semiconductor fins 112 and 114 may include forming a photoresist layer or a capping layer (such as an oxide capping layer) over the structure of FIG. 1F, patterning the photoresist or capping layer to have openings that expose a portion of the semiconductor fins 112 and 114, and etching back material from the semiconductor fins 112 and 114. In some embodiments, the semiconductor fins 112 and 114 can be etched using a dry etching process. Alternatively, the etching process is a wet etching process, or combination dry and wet etching process. Removal may include a lithography process to facilitate the etching process. The lithography process may include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography process is implemented or replaced by other methods, such as maskless photolithography, electron-beam writing, and ion-beam writing. In yet some other embodiments, the lithography process could implement nanoimprint technology. In some embodiments, a pre-cleaning process may be performed to clean the recesses 112*r* and 114*r* with HF or other suitable solution.

Figure 1H:
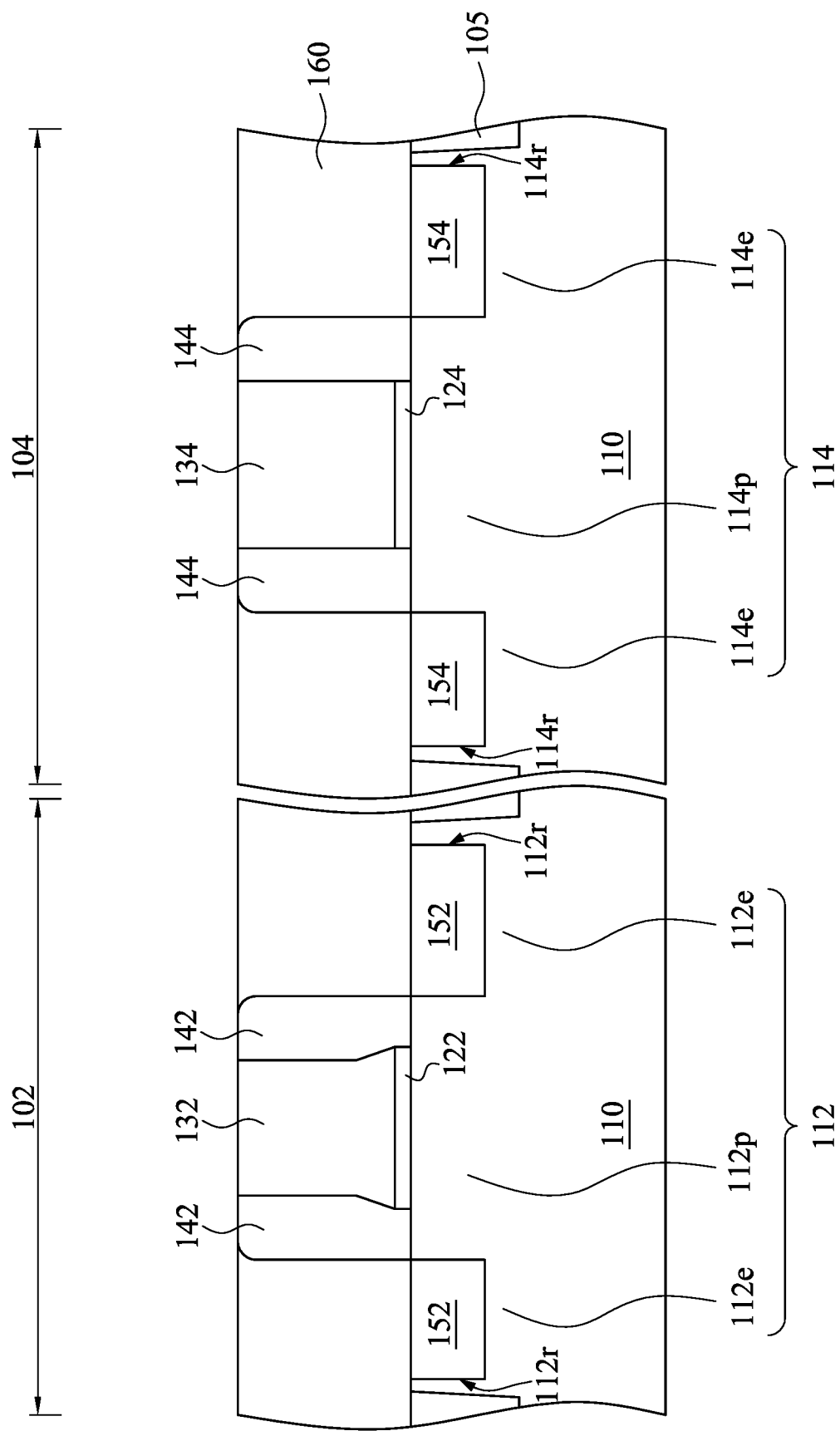

Reference is made to FIG. 1H. A plurality of epitaxy structures 152 and 154 are respectively formed in the recesses 112*r* and 114*r* and on the embedded portions 112*e* and 114*e* of the semiconductor fins 112 and 114. The epitaxy structures 152 and 154 may be formed using one or more epitaxy or epitaxial (epi) processes, such that Si features, SiGe features, and/or other suitable features can be formed in a crystalline state on the embedded portions 112*e* and 114*e* of the semiconductor fins 112 and 114. In some embodiments, the lattice constant of the epitaxy structures 152 and 154 are different from the lattice constant of the semiconductor fins 112 and 114, and the epitaxy structures 152 and 154 are strained or stressed to enable carrier mobility of the semiconductor device and enhance the device performance. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the embedded portions 112*e* and 114*e* of the semiconductor fins 112 and 114 (e.g., silicon). Thus, a strained channel can be achieved to increase carrier mobility and enhance device performance. The epitaxy structures 152 and 154 may be in-situ doped. The doping species include p-type dopants, such as boron or $BF_2$; n-type dopants, such as phosphorus or arsenic; and/or other suitable dopants including combinations thereof. If the epitaxy structures 152 and 154 are not in-situ doped, a second implantation process (i.e., a junction implant process) is performed to dope the epitaxy structures 152 and 154. One or more annealing processes may be performed to activate the epitaxy structures 152 and 154. The annealing processes include rapid thermal annealing (RTA) and/or laser annealing processes.

Then, a dielectric layer 160 is formed at outer sides of the gate spacers 142 and 144 and on the substrate 110. The dielectric layer 160 includes silicon oxide, oxynitride or other suitable materials. The dielectric layer 160 includes a single layer or multiple layers. The dielectric layer 160 is formed by a suitable technique, such as CVD or ALD. A chemical mechanical planarization (CMP) process may be applied to remove excessive dielectric layer 160 and expose the top surface of the dummy gate electrodes 132 and 134 to a subsequent dummy gate removing process.

Figure 1I:
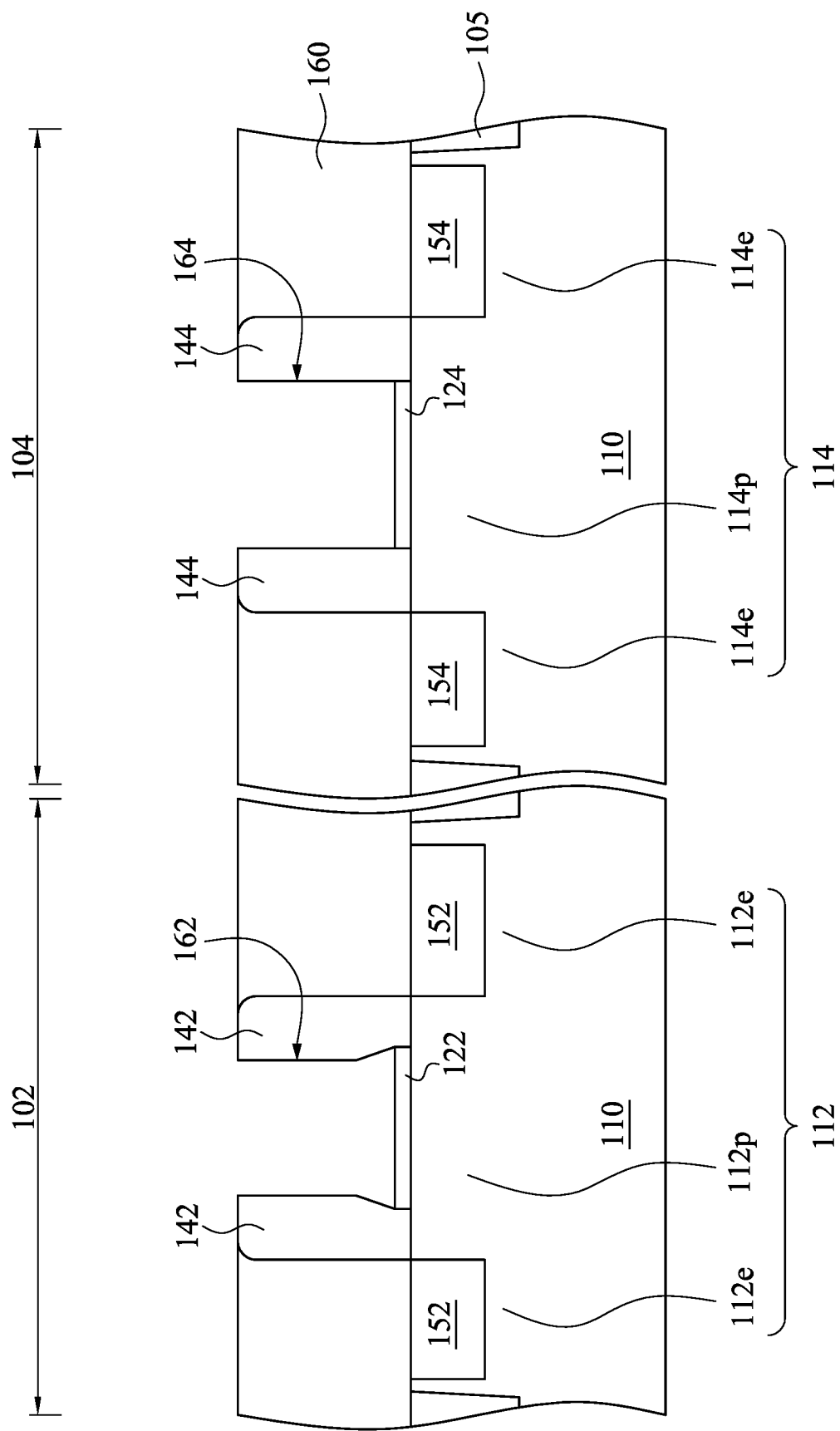

Reference is made to FIG. 1I, the dummy gate electrodes 132 and 134 (see FIG. 1H) are removed to form an opening 162 with the gate spacers 142 as its sidewall and an opening 164 with the gate spacers 144 as its sidewall. In some other embodiments, the gate dielectrics 122 and 124 are removed as well. Alternatively, in some embodiments, the dummy gate electrodes 132 and 134 are removed while the gate dielectrics 122 and 124 retains. The dummy gate electrodes 132 and 134 (and the gate dielectrics 122 and 124) may be removed by dry etch, wet etch, or a combination of dry and wet etch. For example, a wet etch process may include exposure to a hydroxide containing solution (e.g., ammonium hydroxide), deionized water, and/or other suitable etchant solutions.

Figure 1J:
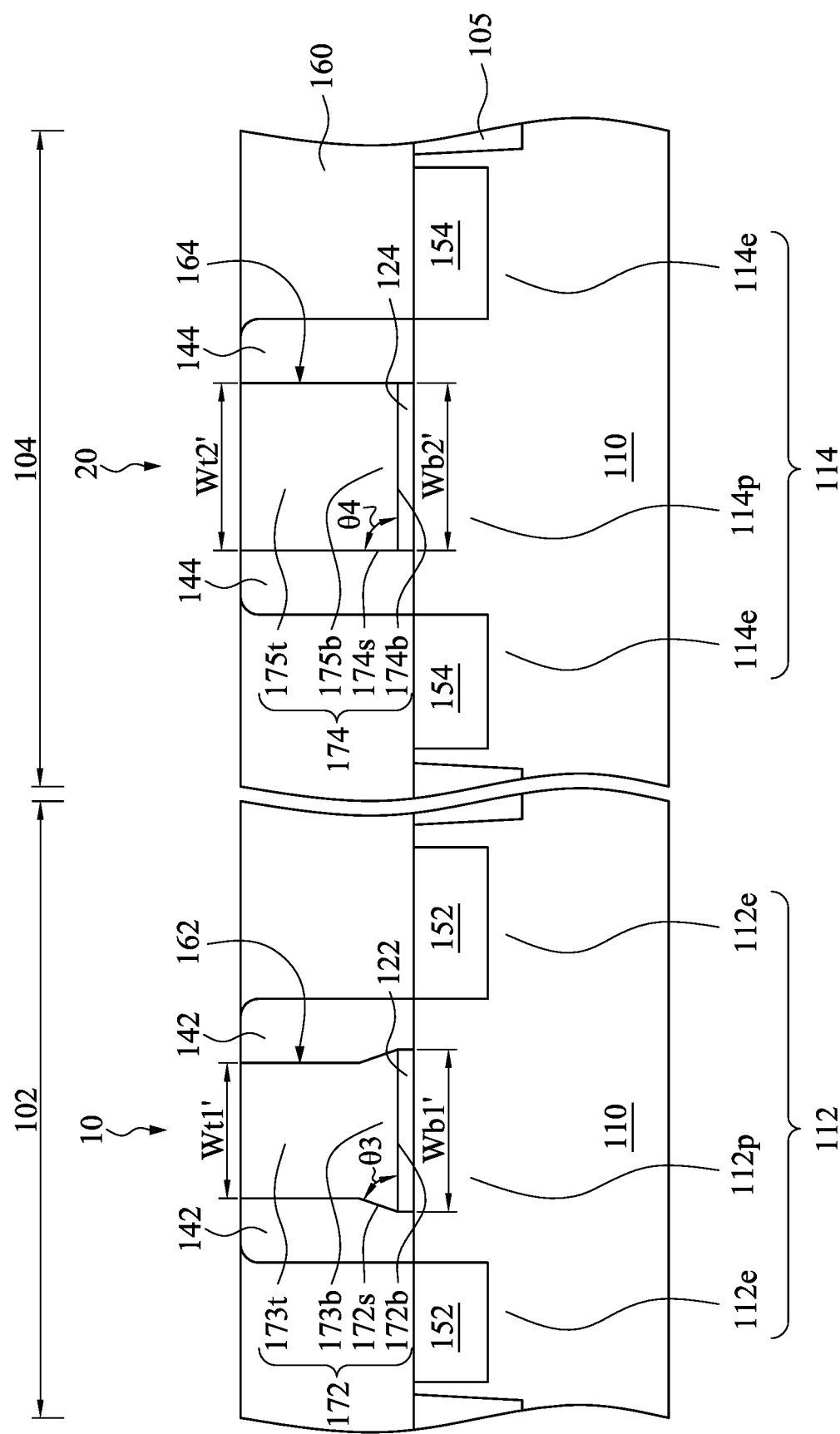

Reference is made to FIG. 1J. Metal gate electrodes 172 and 174 are respectively formed in the openings 162 and 164. The gate electrodes 172 and 174 are formed by the deposition of aluminum or other conductive metal such as copper, tungsten, or titanium. In some embodiments, depositing one of the openings 162 and 164 includes depositing a work function layer prior to depositing a metal fill layer.

In FIG. 1J, the metal gate electrode 172 has a footing profile. In greater detail, the metal gate electrode 172 has a bottom surface 172b and at least one sidewall 172s. The bottom surface 172b and the sidewall 172s intersect to form an interior angle θ3. The interior angle θ3 is an angle inside the metal gate electrode 172. In FIG. 1J, the interior angle θ3 is an acute angle. That is, the interior angle θ3 is less than 90 degrees. To describe from another point of view, the metal gate electrode 172 includes a top portion 173t and a bottom portion 173b disposed between the top portion 173t and the substrate 110. The top portion 173t has a width Wt1', and the bottom portion 173b has a width Wb1'. The width Wb1' of the bottom portion 173b is greater than the width Wt1' of the top portion 173t.

Figure 3A:
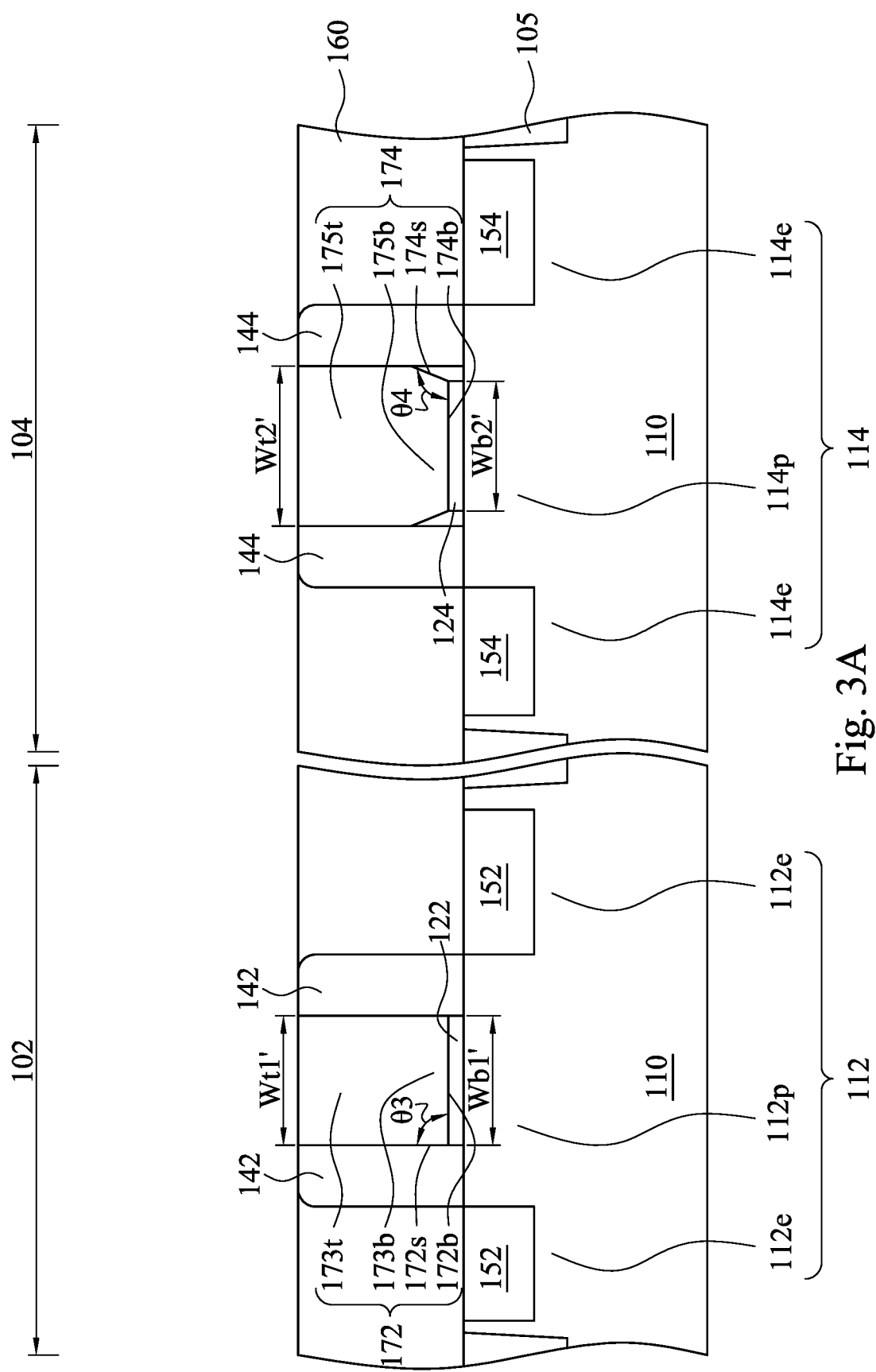
FIGS. 3A and 3B are cross-sectional views of the semiconductor device at stage of FIG. 1J in accordance with some embodiments of the present disclosure.
Figure 3B:
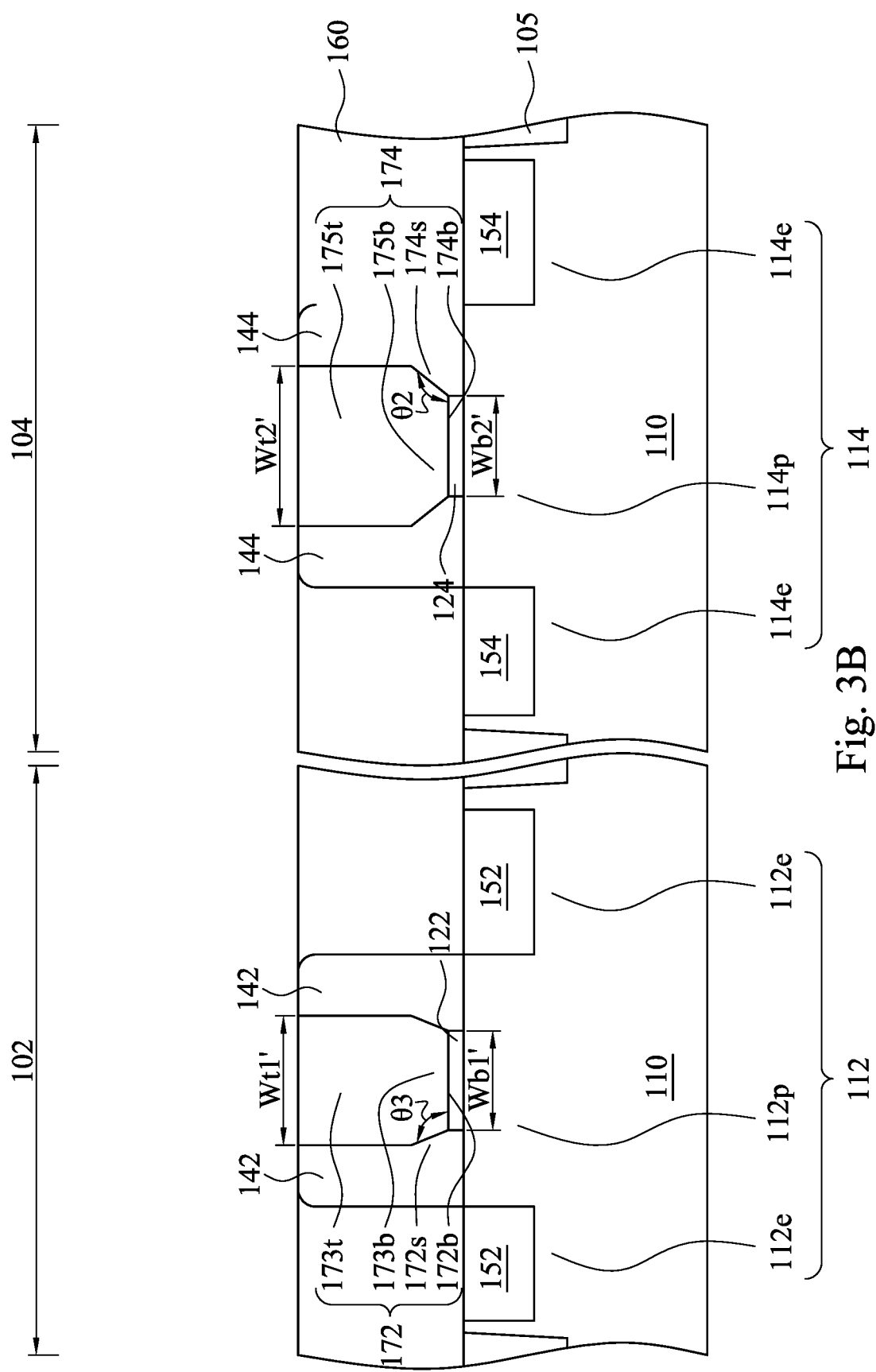

However, the profile of the metal gate electrode 172 is not limited in this respect. FIGS. 3A and 3B are cross-sectional views of the semiconductor device at stage of FIG. 1J in accordance with some embodiments of the present disclosure. In FIG. 3A, the interior angle θ3 is a substantially right angle. That is, the interior angle θ3 is substantially 90 degrees. Furthermore, the width Wb1' of the bottom portion 173b is substantially the same as the width Wt1' of the top portion 173t. The term "substantially" as used herein may be applied to modify any quantitative representation which could permissibly vary without resulting in a change in the basic function to which it is related. In FIG. 3B, the interior angle θ3 is an obtuse angle. That is, the interior angle θ3 is greater than 90 degrees. Furthermore, the width Wb1' of the bottom portion 173b is narrower than the width Wt1 of the top portion 173t. Hence, the metal gate electrode 172 in FIG. 3B has a notch profile.

Moreover, in FIG. 1J, the metal gate electrode 174 has a bottom surface 174b and at least one sidewall 174s. The bottom surface 174b and the sidewall 174s intersect to form an interior angle θ4. The interior angle θ4 is an angle inside the metal gate electrode 174. In FIG. 1J, the interior angle θ4 is a substantially right angle. That is, the interior angle θ4 is substantially 90 degrees. To describe from another point of view, the metal gate electrode 174 includes a top portion 175t and a bottom portion 175b disposed between the top portion 175t and the substrate 110. The top portion 175t has a width Wt2', and the bottom portion 175b has a width Wb2'. The width Wb2' of the bottom portion 175b is substantially the same as the width Wt2' of the top portion 175t.

However, the profile of the metal gate electrode 174 is not limited in this respect. Reference is made to FIGS. 3A and 3B. In FIGS. 3A and 3B, the interior angles θ4 are an obtuse angle. That is, the interior angle θ4 is greater than 90 degrees. Furthermore, the width Wb2' of the bottom portion 175b is narrower than the width Wt2' of the top portion 175t. Hence, the dummy gate electrodes 174 in FIGS. 3A and 3B have notch profiles.

In FIG. 1J, the semiconductor fin 112, the epitaxy structures 152, and the metal gate electrode 172 (or the dummy gate electrode 132 of FIG. 1E) form a core device 10, and the semiconductor fin 114, the epitaxy structures 154, and the metal gate electrode 174 (or the dummy gate electrode 134 of FIG. 1E) form an I/O device 20. In FIG. 1J, both of the core device 10 and the I/O device 20 are finFETs.

Figure 1K:
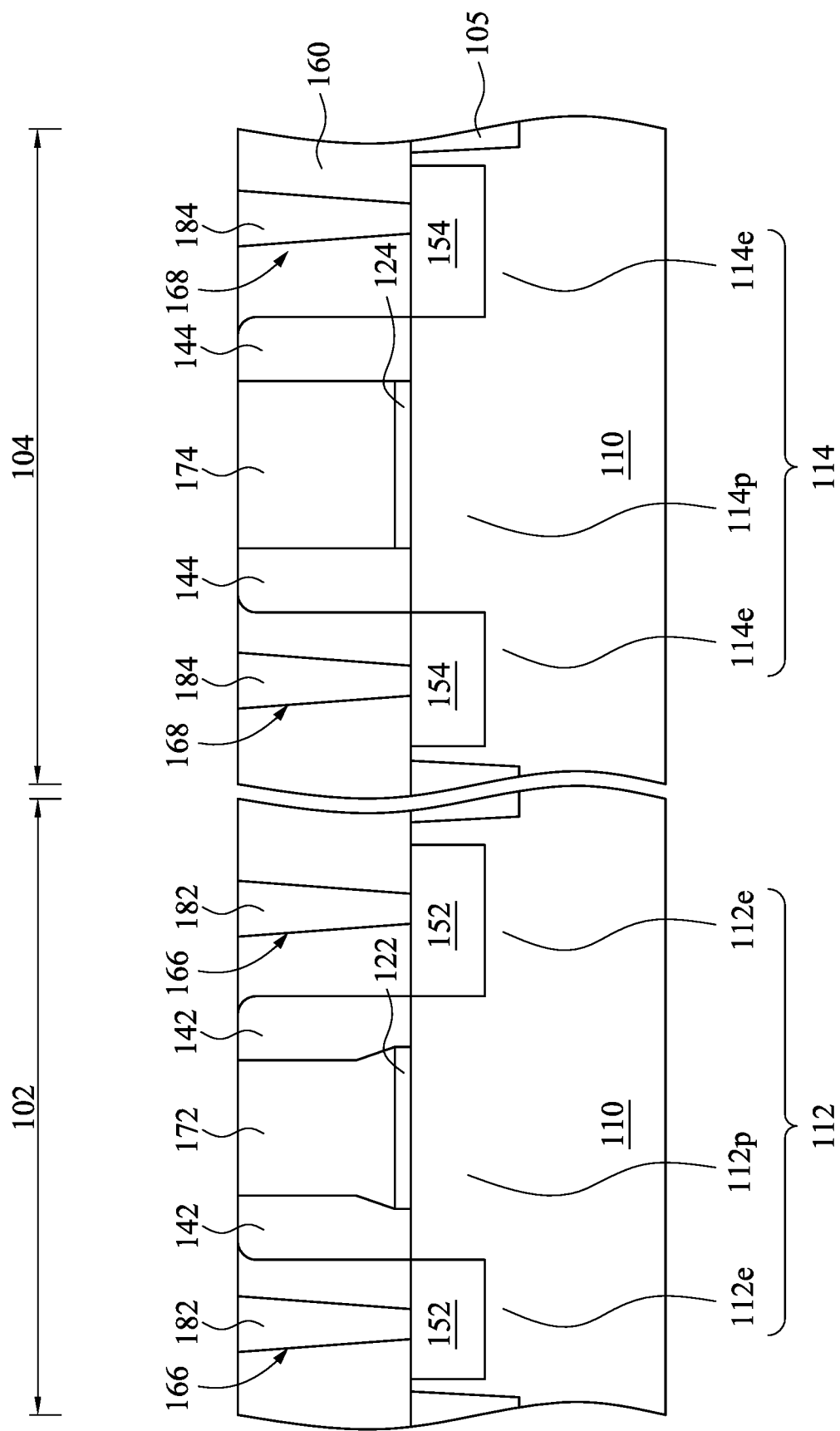

Reference is made to FIG. 1K. Trenches 166 and 168 are formed in the dielectric layer 160. The trenches 166 expose the epitaxy structures 152, and the trenches 168 expose the epitaxy structures 154. Metal such as tungsten is then deposited into the trenches 166 and 168 down to the epitaxy structures 152 and 154 to form source and drain contacts 182 and 184. When formed, the source and drain contacts 182 and 184 are conductively coupled to the epitaxy structures 152 and 154.

According to the aforementioned embodiments, the interior angle of the gate electrode (i.e., the metal gate electrode or the dummy gate electrode) of the core device can be tuned as an acute angle, a substantially right angle, or an obtuse angle. Also, the interior angle of the gate electrode (i.e., the metal gate electrode or the dummy gate electrode) of the I/O device can be tuned as a substantially right angle or an obtuse angle. Furthermore, the interior angle of the metal gate electrode (or the dummy gate electrode) of the I/O device is greater than the interior angle of the metal gate electrode (or the dummy gate electrode) of the core device. Hence, the parasitic capacitance of the core device and the input/output device can be improved. Furthermore, the profiles of the gate electrodes of the core device and the I/O device can be tuned to meet both the electrical properties (such as break down voltages) of the core device and the I/O device.

An aspect of the disclosure provides a semiconductor device, which includes a substrate, a core device over the substrate, and an input/output (I/O) device over the substrate. The core device includes a first gate electrode having a bottom surface and a sidewall that define a first interior angle therebetween. The first interior angle is an obtuse angle. The I/O device includes a second gate electrode having a bottom surface and a sidewall that define a second interior angle therebetween. The second interior angle is greater than the first interior angle.

According to some embodiments, the first gate electrode has a bottom width and a top width greater than the bottom width.

According to some embodiments, the second gate electrode has a bottom width and a top width greater than the bottom width.

According to some embodiments, the I/O device further comprises a spacer on the sidewall of the second gate electrode, and a bottom width of the spacer is greater than a top width of the spacer.

According to some embodiments, the core device further comprises a spacer on the sidewall of the first gate electrode, and a bottom width of the spacer is greater than a top width of the spacer.

An aspect of the disclosure provides a semiconductor device, which includes a substrate, a core device over the substrate, and an input/output (I/O) device over the substrate. The core device includes a first gate electrode having a bottom surface and a sidewall that define a first interior angle therebetween. The I/O device includes a second gate electrode having a bottom surface and a sidewall that define a second interior angle therebetween. The second interior angle is an obtuse angle and is greater than the first interior angle.

According to some embodiments, the first interior angle is a substantially right angle.

According to some embodiments, the first interior angle is an obtuse angle.

According to some embodiments, the first interior angle is an acute angle.

According to some embodiments, the first gate electrode has a first bottom width, and the second gate electrode has a second bottom width greater than the first bottom width.

According to some embodiments, the first gate electrode has a first top width, and the second gate electrode has a second top width greater than the first top width.

According to some embodiments, the second gate electrode has a bottom width and a top width greater than the bottom width.

An aspect of the disclosure provides a semiconductor device, which includes a substrate, a core device over the substrate, and an input/output (I/O) device over the substrate. The core device includes a first gate electrode. The I/O device includes a second gate electrode having a top portion and a bottom portion that has a smaller width than the top portion, in which a first top width of a top portion of the first gate electrode is less than a second top width of the top portion of the second gate electrode.

According to some embodiments, the first gate electrode has a bottom portion that has a smaller width than the first top width.

According to some embodiments, the first gate electrode has a bottom portion that has a greater width than the first top width.

According to some embodiments, the first gate electrode has a bottom portion that has a width substantially equal to the first top width.

According to some embodiments, the core device further comprises a semiconductor fin disposed between the first gate electrode and the substrate.

According to some embodiments, the I/O device further comprises a semiconductor fin disposed between the second gate electrode and the substrate.

According to some embodiments, the I/O device further comprises a spacer on a sidewall of the second gate electrode, and a bottom width of the spacer is greater than a top width of the spacer.

According to some embodiments, the core device further comprises a spacer on a sidewall of the first gate electrode, and a bottom width of the spacer is greater than a top width of the spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate;
   a core device over the substrate and comprising a first gate electrode having a bottom surface and a sidewall, wherein the bottom surface of the first gate electrode and the sidewall of the first gate electrode define inside the first gate electrode a first interior angle, and the first interior angle is an obtuse angle; and
   an input/output (I/O) device over the substrate and comprising a second gate electrode having a bottom surface and a sidewall, wherein the bottom surface of the second gate electrode and the sidewall of the second gate electrode define inside the second gate electrode a second interior angle, and the second interior angle is greater than the first interior angle.

2. The semiconductor device of claim 1, wherein the bottom surface of the first gate electrode has a bottom width and the first gate electrode includes a top surface that has a top width and the top width is greater than the bottom width.

3. The semiconductor device of claim 1, wherein the bottom surface of the second gate electrode has a bottom width and the second gate electrode includes a top surface that has a top width and the top width is greater than the bottom width.

4. The semiconductor device of claim 1, wherein the I/O device further comprises a spacer on the sidewall of the second gate electrode, and a bottom width of a bottom surface of the spacer is greater than a top width of a top surface of the spacer.

5. The semiconductor device of claim 1, wherein the core device further comprises a spacer on the sidewall of the first gate electrode, and a bottom width of a bottom surface of the spacer is greater than a top width of a top surface of the spacer.

6. A semiconductor device comprising:
   a substrate;
   a core device over the substrate and comprising a first gate electrode having a bottom surface and a sidewall, wherein the bottom surface of the first gate electrode and the sidewall of the first gate electrode define inside the first gate electrode a first interior angle; and
   an input/output (I/O) device over the substrate and comprising a second gate electrode having a bottom surface and a sidewall, wherein the bottom surface of the second gate electrode and the sidewall of the second gate electrode define inside the second gate electrode a second interior angle, and the second interior angle and the first interior angle both are obtuse angles but have different values.

7. The semiconductor device of claim 6, wherein the bottom surface of the first gate electrode has a first bottom width, the bottom surface of the second gate electrode has a second bottom width, and the second bottom width is greater than the first bottom width.

8. The semiconductor device of claim 6, wherein the first gate electrode includes a top surface that has a first top width, the second gate electrode includes a top surface that has a second top width, and the second top width is greater than the first top width.

9. The semiconductor device of claim 6, wherein a difference between widths of the bottom surface and a top surface of the second gate electrode is greater than a difference between widths of the bottom surface and a top surface of the first gate electrode.

10. The semiconductor device of claim 6, wherein the second interior angle is greater than the first interior angle.

11. The semiconductor device of claim 6, wherein the I/O device further comprises a spacer on a sidewall of the second gate electrode, and a bottom width of a bottom surface of the spacer is greater than a top width of a top surface of the spacer.

12. A semiconductor device comprising:
   a substrate;
   a core device over the substrate and comprising a first gate electrode having a top surface and a bottom surface; and an input/output (I/O) device over the substrate and comprising a second gate electrode having a top surface and a bottom surface, wherein a width of the top surface of the first gate electrode is less than a width of the top surface of the second gate electrode, and a width of the bottom surface of the second gate electrode is less than the width of the top surface of the second gate electrode.

13. The semiconductor device of claim 12, wherein a width of the bottom surface of the first gate electrode is smaller than the width of the top surface of the first gate electrode.

14. The semiconductor device of claim 12, wherein a width of the bottom surface of the first gate electrode is greater than the width of the top surface of the first gate electrode.

15. The semiconductor device of claim 12, wherein a width of the bottom surface of the first gate electrode is substantially equal to the width of the top surface of the first gate electrode.

16. The semiconductor device of claim 12, wherein the core device further comprises a semiconductor fin disposed between the first gate electrode and the substrate.

17. The semiconductor device of claim 12, wherein the I/O device further comprises a semiconductor fin disposed between the second gate electrode and the substrate.

18. The semiconductor device of claim 12, wherein the I/O device further comprises a spacer on a sidewall of the second gate electrode, and a bottom width of a bottom surface of the spacer is greater than a top width of a top surface of the spacer.

19. The semiconductor device of claim 12, wherein the core device further comprises a spacer on a sidewall of the first gate electrode, and a bottom width of a bottom surface of the spacer is greater than a top width of a top surface of the spacer.

20. The semiconductor device of claim 12, wherein a width of the bottom surface of the first gate electrode minus the width of the top surface of the first gate electrode is greater than the width of the bottom surface of the second gate electrode minus the width of the top surface of the second gate electrode.

* * * * *